(12) United States Patent
Wang et al.

(10) Patent No.: US 11,169,564 B2
(45) Date of Patent: Nov. 9, 2021

(54) TIMING CIRCUIT AND TIMING METHOD

(71) Applicant: Nanjing Silergy Micro Technology Co., Ltd., Nanjing (CN)

(72) Inventors: Xingyue Wang, Nanjing (CN); Ran Li, Nanjing (CN); Junjie Qiao, Nanjing (CN)

(73) Assignee: Nanjing Silergy Micro Technology Co., Ltd., Nanjing (CN)

( * ) Notice: Subject to any disclaimer, the term of this patent is extended or adjusted under 35 U.S.C. 154(b) by 0 days.

(21) Appl. No.: 17/007,118

(22) Filed: Aug. 31, 2020

(65) Prior Publication Data
US 2021/0064077 A1 Mar. 4, 2021

(30) Foreign Application Priority Data

Sep. 4, 2019 (CN) .......................... 201910831726.2

(51) Int. Cl.
G06F 1/04 (2006.01)
G06F 1/14 (2006.01)
H03L 7/097 (2006.01)

(52) U.S. Cl.
CPC ................ G06F 1/14 (2013.01); H03L 7/097 (2013.01)

(58) Field of Classification Search
CPC .................................. G06F 1/14; H03L 7/097
USPC .......................................................... 327/291
See application file for complete search history.

(56) References Cited

U.S. PATENT DOCUMENTS

| 8,508,206 | B2 | 8/2013 | Wan et al. |
| 8,773,047 | B2 | 7/2014 | Chen |
| 8,890,500 | B2 | 11/2014 | Cheng |
| 9,054,592 | B2 | 6/2015 | Yao et al. |
| 9,192,007 | B2 | 11/2015 | Zhang |
| 9,325,254 | B2 | 4/2016 | Deng et al. |
| 2015/0145489 | A1 | 5/2015 | Hou et al. |
| 2017/0155319 | A1 | 6/2017 | Deng et al. |
| 2018/0294028 | A1* | 10/2018 | Lee ................ G11C 11/40611 |
| 2019/0028106 | A1* | 1/2019 | Annema ................ H03L 7/085 |
| 2019/0199360 | A1* | 6/2019 | Takahashi .............. H03L 7/091 |
| 2020/0044659 | A1* | 2/2020 | Li ........................ H03M 1/123 |

* cited by examiner

Primary Examiner — Ryan Jager

(57) ABSTRACT

A timing circuit can include: a low-precision clock source configured to generate a low-precision clock signal; a high-precision clock source configured to intermittently generate a high-precision clock signal; and a cycle conversion circuit configured to count the pulses of the high-precision clock signal and the low-precision clock signal during a same period, and to obtain a conversion cycle according to count results and a rated cycle of the high-precision clock signal.

15 Claims, 2 Drawing Sheets

TIMING CIRCUIT AND TIMING METHOD

RELATED APPLICATIONS

This application claims the benefit of Chinese Patent Application No. 201910831726.2, filed on Sep. 4, 2019, which is incorporated herein by reference in its entirety.

FIELD OF THE INVENTION

The present invention generally relates to the field of power electronics, and more particularly to timing circuits and methods.

BACKGROUND

Timing circuits may utilize on-chip low-precision clock sources instead of high precision clock sources due to their lower costs, relative size, and power consumption. However, with changes in temperature and voltage, the clock generated by a low-precision clock source often becomes slowly mismatched with a particular reference time frame. Moreover, the clock frequency may also undergo changes as the device ages, thus preventing the clock frequency from meeting precision requirements. This can cause issues with inaccurate timing and timed intervals. In one case, a more accurate timed interval can be obtained by adjusting the frequency of the clock source. However, this approach is reliant on the consistency and precision of clock generator, which can be uncertain.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In one embodiment, a timing circuit can include: (i) a low-precision clock source configured to generate a low-precision clock signal; (ii) a high-precision clock source configured to intermittently generate a high-precision clock signal; and (iii) a cycle conversion circuit configured to count the pulses of the high-precision clock signal and the low-precision clock signal during a same period, and to obtain a conversion cycle according to count results and a rated cycle of the high-precision clock signal.

In one embodiment, a timing method can include: (i) generating a low-precision clock signal by a low precision clock source; (ii) intermittently generating a high-precision clock signal by a high-precision clock source; (iii) counting pulses of the high-precision clock signal and the low-precision clock signal respectively during a same period; and (iv) obtaining a conversion cycle according to count results and a rated cycle of the high-precision clock signal.

Figure 1:
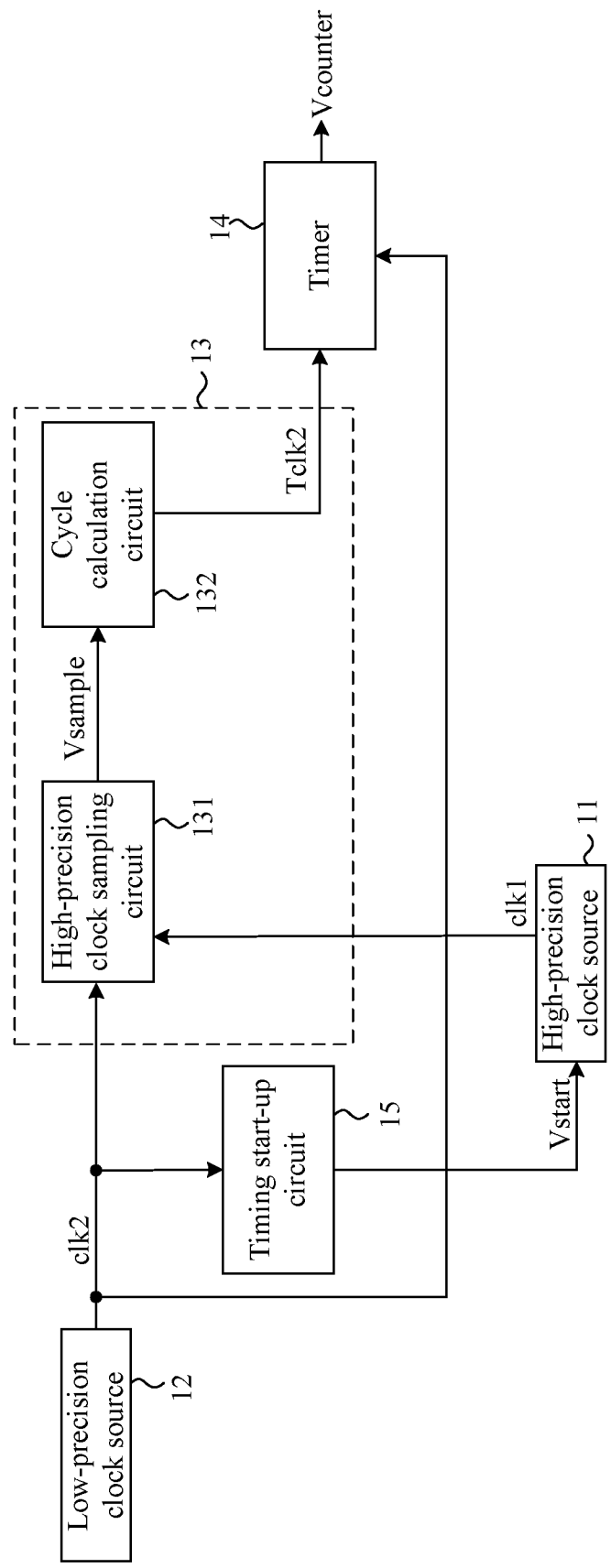
FIG. 1 is a schematic block diagram of an example timing circuit, in accordance with embodiments of the present invention.

Referring now to FIG. 1, shown is a schematic block diagram of an example timing circuit, in accordance with embodiments of the present invention. In this particular example, the timing circuit can include high-precision clock source 11, low-precision clock source 12, cycle conversion circuit 13, and timer 14. High-precision clock source 11 can generate high-precision clock signal clk1 intermittently, and low-precision clock source 12 can generate low-precision clock signal clk2. Here, the frequency and the frequency precision of high-precision clock source 11 is higher than that of low-precision clock source 12. That is, the frequency of high-precision clock signal clk1 drifts slightly with changes in voltage and temperature such that high-precision clock source 11 can be regarded as an ideal clock source.

For example, cycle conversion circuit 13 can count pulses of high-precision clock signal clk1 and low-precision clock signal clk2, respectively, during the same period. Moreover, conversion cycle Tclk2 can be obtained according to the counting result and rated cycle Tclk1 of high-precision clock signal clk1. Since the frequency precision of low precision clock signal clk2 may not meet the precision demanded thereof, conversion cycle Tclk2 representing low-precision clock signal clk2 can be obtained through a digital algorithm after counting the pulses of low-precision clock signal clk2 based on high-precision clock signal clk1 generated from high-precision clock source 11, thereby obtaining a more accurate timing result.

In some embodiments, cycle conversion circuit 13 can also count the pulses of high precision clock signal clk1 in a period during which a predetermined number of pulses of low-precision clock signal clk2 are generated. In addition, conversion cycle Tclk2 can be obtained according to the counting result and rated cycle Tclk1. In this case, as long as the number of pulses of low precision clock signal clk2 is preset, cycle conversion circuit 13 can obtain conversion cycle Tclk2 simply via the counting result of the pulses of high-precision clock signal clk1.

For example, cycle conversion circuit 13 can include high-precision clock sampling circuit 131 and cycle calculation circuit 132. For example, high-precision clock sampling circuit 131 can count the pulses of high-precision clock signal clk1 in the period during which n pulses of low-precision clock signal clk2 are generated, and may obtain the counting result N. Moreover, cycle calculation circuit 132 can obtain conversion cycle Tclk2 according to the formula $Tclk2=(N/n)*Tclk1$, where Tclk1 is the rated cycle of high-precision clock signal clk1.

In particular embodiments, after counting the pulses of high-precision clock signal clk1 in the period during which n pulses of low-precision clock signal clk2 are generated, the cycle of low-precision clock signal clk2 generated from low-precision clock source 12 can be measured by rated cycle Tclk1. Furthermore, conversion cycle Tclk2 that represents the cycle of low-precision clock signal clk2 may be obtained via a digital algorithm such that a more accurate timing signal Vcounter can be obtained by a timer in the post stage.

Timer 14 can generate timing signal Vcounter in real time according to conversion cycle Tclk2 and the counting result for the pulses of low-precision clock signal clk2 during the required period. In certain embodiments, timing signal Vcounter may be generated in real time through accumulation.

In addition, due to the high power consumption of high-precision clock source 11, the overall power consumption of the timing circuit can be relatively high when high-precision clock source 11 is always under operation. In order to decrease the power consumption, high precision clock source 11 can intermittently generate high-precision clock signal clk1. In addition, the timing circuit can include timing start-up circuit 15, which may enable high-precision clock source 11 according to a predetermined interval and start cycle conversion circuit 13 to update conversion cycle Tclk2.

For example, timing start-up circuit 15 can generate timing start-up signal Vstart according to low-precision clock signal clk2. In one embodiment, timing start-up signal Vstart can be active during n cycles of low-precision clock signal clk2 and inactive for next m cycles of low precision clock signal clk2 (e.g., pattern remains the same for subsequent cycles), where m and n are positive integers.

High precision clock source 11 can generate high-precision clock signal clk1 when timing start-up signal Vstart is active, and may not be enabled to generate high-precision clock signal clk1 when timing start-up signal Vstart is inactive. In this way, the timing circuit can achieve higher precision while also reducing the power consumption of high-precision clock source 11. When high-precision clock signal clk1 is detected by high-precision clock sampling circuit 131 in cycle conversion circuit 13, cycle conversion circuit 13 can be enabled to update conversion cycle Tclk2.

Figure 2:
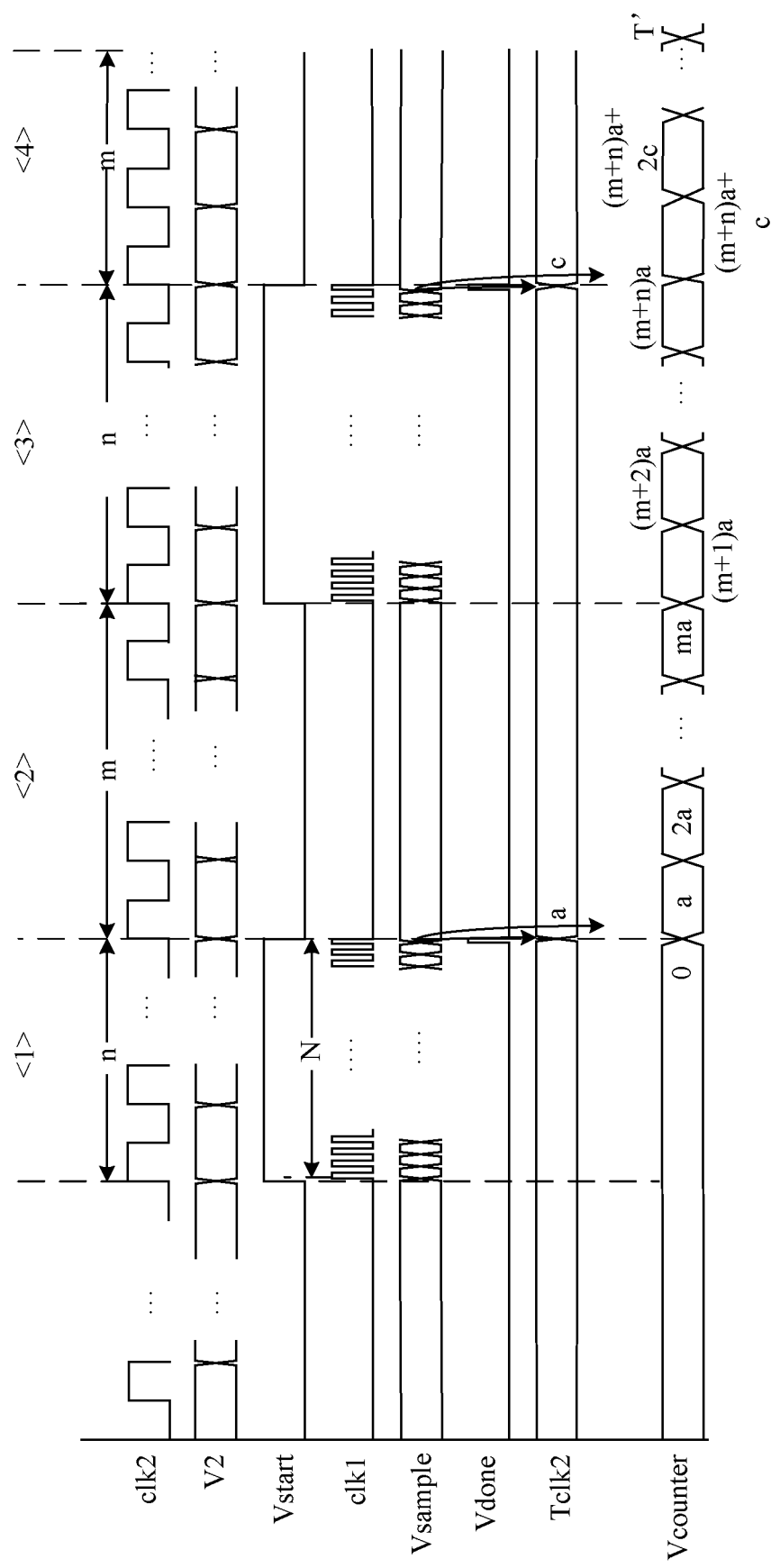
FIG. 2 is a waveform diagram of example operation of the timing circuit, in accordance with embodiments of the present invention.

Referring now to FIG. 2, shown is a waveform diagram of an example operation of the timing circuit, in accordance with embodiments of the present invention. When low-precision clock signal clk2 is sampled by using high-precision clock signal clk1, an error can be generated in the sampling process since the low-precision clock signal clk2 and high-precision clock signal clk1 are not synchronized. Further, the error caused during the synchronization process can reach one cycle of high-precision clock clk1. Here, the rated cycle of high-precision clock signal clk1 is Tclk1, the precision of the high-precision clock source is $A_1$ (ppm), and actual cycle Tclk1_real of high-precision clock signal clk1 can be obtained through the following formula (1):

$$Tclk1\_real = Tclk1 \pm Tclk1 \times A_1/10^6 \quad (1)$$

The maximum error $^{\Delta}_1$ of the cycle of high-precision clock signal clk1 can be obtained through the formula: $^{\Delta}_1 = Tclk1 \times A_1/10^6$. As shown in part <1> in FIG. 2, N high-precision clock signals clk1 can be generated during n cycles of low precision clock signal clk2. Conversion cycle Tclk2 of low-precision clock signal clk2 may be calculated by cycle calculation circuit 132. Since the maximum error in the process of sampling is one cycle of high precision clock signal clk1, the following formula (2) can be obtained:

$$Tclk2 = (N+1) \times Tclk1\_real/n = (N+1) \times (Tclk1+^{\Delta}_1)/n \quad (2)$$

When the clock precision of high-precision clock signal clk1 is relatively high, error $^{\Delta}_1$ of the cycle of rated cycle Tclk1 can be ignored. Here, the real cycle of low-precision clock signal clk2 is Tclk2_real, and maximum error $^{\Delta}_2$ between calculated conversion cycle Tclk2 and real cycle Tclk2_real of low-precision clock signal clk2 can be expressed by formula (3):

$$^{\Delta}_2 = +(Tclk1+^{\Delta}_1)/n \quad (3)$$

Further, the error precision of conversion cycle Tclk2 and real cycle Tclk2_real can be obtained by formula (4):

$$A_2 = ^{\Delta}_2/Tclk2\_real \times 10^6 \quad (4)$$

It can be seen from the formulas above that the greater the number of sampling cycles for high precision clock signal clk1, the higher the frequency precision and the frequency of high precision clock signal clk1. In addition, conversion cycle Tclk2 may approach the real cycle Tclk2_real of low precision clock signal clk2 more in this case. When error precision $A_2$ is much smaller than required error precision $A_3$, timing signal Vcounter may approach the real timed interval.

In some cases, the timer may add 1 for each clock cycle, and the final accumulated value can be multiplied by one clock cycle to obtain the current timed interval. In this way, the number of clock cycles that are required to be obtained in advance when the timing value is known and the number of clock cycles may be taken as a timing threshold to realize timing. However, this may only be suitable for high-precision clock sources, since a timing operation that meets the precision demand may not be realized once the clock signal drifts.

In particular embodiments, the process of timing can occur by accumulating the cycles of low-precision clock signal clk2. That is, each conversion cycle Tclk2 may be accumulated in order to obtain the timing value without obtaining the number of the clock cycles desired beforehand, where the timing value is directly taken as a timing threshold.

Since low-precision clock source 12 is a clock source with lower precision, conversion cycle Tclk2 may not be used to accumulate for an extended period of time since it is merely an approximate value for real cycle Tclk2_real of low-precision clock signal clk2. After some duration, the previously calculated conversion cycle Tclk2 can be quite different from real cycle Tclk2_real, and in fact may even exceed the required precision range. In such a case, the error of the timing value may be invariably large.

In order to solve this problem, timing start-up circuit 15 can obtain the current conversion cycle Tclk2 in order to prevent the difference between the calculated value and the real value from exceeding the required precision range. In FIG. 2, high-precision clock signal clk1 can be generated after timing start-up signal Vstart is active. As shown in part <1>, after timing start-up signal Vstart is active, the pulses of low-precision clock signal clk2 may be counted to generate count result V2, and the pulses of high-precision clock signal clk1 may be generated and counted to generate count result Vsample. When count result V2 is equal to n, timing start-up signal Vstart can be deactivated and count result Vsample can be obtained.

At this time, indication signal Vdone may be active to indicate that cycle conversion circuit 13 can start to calculate conversion cycle Tclk2. Additionally, timer 14 can obtain current conversion cycle Tclk2 (e.g., which is equal to a) before conversion cycle Tclk2 is used for timing. As shown part <2> of FIG. 2, timer 14 may utilize "a" to accumulate according to low-precision clock signal clk2. In addition, timing start-up circuit 15 can begin to count the pulses of low-precision clock signal clk2, and timing start-up signal Vstart may again become active when the count value is m (e.g., predetermined interval). During this period, the cycle of low precision clock signal clk2 can be about to drift out of the required precision range after m cycles of low-precision clock signal clk2. Then, during next n cycles, cycle conversion circuit 13 may start to update conversion cycle Tclk2 (e.g., which is equal to c) while timer 14 still uses "a" to accumulate as shown in part <3> in FIG. 2. When indication signal Vdone is active, the conversion may be completed. Then timer 14 uses the updated conversion cycle "c" to accumulate as part <4> in FIG. 2 shows. In this way, final timing value T' (e.g., timing signal Vcounter) can meet the precision requirement.

During m cycles as shown in part <2> of FIG. 2, timing value T1 can be represented by the following formula (5):

$$T_1 = \sum_1^m a \quad (5)$$

During n cycles as shown in part <3> of FIG. 2, timing value T2 can be represented by the following formula (6):

$$T_2 = \sum_1^n a \quad (6)$$

During n cycles as shown in part <3> of FIG. 2, timing value T3 can be represented by the following formula (7):

$$T_3 = \sum_1^m c \quad (7)$$

Thus, final timing value T' can be represented by the following formula (8):

$$T' = T_1 + T_2 + T_3 + \ldots = (m+m) \times a + m \times c + \quad (8)$$

The final timing value T' can therefore meet the precision requirement; that is, final timing value T' can meet the required time range as shown in the following formula (9):

$$T - \frac{T \times A_3}{10^4} \leq T' \leq T + \frac{T \times A_3}{10^4} \quad (9)$$

In particular embodiments, a more accurate clock cycle of a low-precision clock source can be obtained by using a high-precision clock source without adjusting the frequency of the low-precision clock source. In addition, by accumulating the clock cycle of the low-precision clock source and starting both the high-precision clock source and the cycle conversion circuit at regular time intervals, the timing value can be more accurate while also reducing power consumption.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A timing circuit, comprising:
    a) a low-precision clock source configured to generate a low-precision clock signal;
    b) a high-precision clock source configured to intermittently generate a high-precision clock signal; and
    c) a cycle conversion circuit configured to count the pulses of the high-precision clock signal and the low-precision clock signal during a same period, and to obtain a conversion cycle according to count results and a rated cycle of the high-precision clock signal.

2. The timing circuit of claim 1, wherein the cycle conversion circuit is configured to count the pulses of the high-precision clock signal in the period during which a predetermined number of pulses of the low-precision clock signal are generated, in order to generate a first count result, and to obtain the conversion cycle according to the first count result and the rated cycle of the high-precision clock signal.

3. The timing circuit of claim 1, further comprising a timer configured to generate a timing signal according to the conversion cycle and the low-precision clock signal.

4. The timing circuit of claim 3, wherein the timer is configured to accumulate the updated conversion cycle according to the pulses of the low precision clock signal.

5. The timing circuit of claim 1, further comprising a timing start-up circuit configured to enable the high-precision clock source and the cycle conversion circuit to update the conversion cycle every predetermined time interval.

6. The timing circuit of claim 5, wherein the timing start-up circuit is configured to generate a timing start-up signal to start the cycle conversion circuit according to the low precision clock signal, in order to enable the cycle conversion circuit.

7. The timing circuit of claim 6, wherein the current conversion cycle maintains the last conversion cycle before the cycle conversion circuit completes the update of the conversion cycle.

8. The timing circuit of claim 6, wherein the timing start-up signal is active during n cycles of the low-precision clock signal and the timing start-up signal is inactive during next m cycles of the low precision clock signal, wherein both m and n are positive integers.

9. The timing circuit of claim 6, wherein the high-precision clock source is configured to generate the high-precision clock signal when the timing start-up signal is active.

10. The timing circuit of claim 2, wherein the cycle conversion circuit comprises a high-precision clock sample circuit configured to count the pulses of the high-precision clock signal during n cycles of the low-precision clock signal and obtain first count result N.

11. The timing circuit of claim 10, wherein the cycle conversion circuit further comprises a cycle calculation circuit configured to obtain the conversion cycle according to the formula Tclk2=(N/n)*Tclk1, Tclk1 is the rated cycle of the high-precision clock signal, and Tclk2 is the conversion cycle.

12. A timing method, comprising:
    a) generating a low-precision clock signal by a low precision clock source;
    b) intermittently generating a high-precision clock signal by a high-precision clock source;
    c) counting pulses of the high-precision clock signal and the low-precision clock signal respectively during a same period; and
    d) obtaining a conversion cycle according to count results and a rated cycle of the high-precision clock signal.

13. The method of claim 12, further comprising:
    a) counting the pulse of the high-precision clock signal in the period during which a predetermined number of pulses of the low precision clock signal are generated to generate a first count result; and b) obtaining the conversion cycle according to the first count result and the rated cycle of the high precision clock signal.

14. The method of claim 12, further comprising generating a timing signal according to the conversion cycle and the low precision clock signal.

15. The method of claim 12, further comprising updating the conversion cycle every predetermined time interval.

* * * * *